(12) United States Patent
Crippa et al.

(10) Patent No.: US 10,551,433 B2
(45) Date of Patent: Feb. 4, 2020

(54) TESTING HEAD COMPRISING VERTICAL PROBES

(71) Applicant: TECHNOPROBE S.p.A., Cernusco Lombardone (IT)

(72) Inventors: Roberto Crippa, Cernusco Lombardone (IT); Raffaele Vallauri, Cernusco Lombardone (IT); Emanuele Bertarelli, Cernusco Lombardone (IT); Daniele Perego, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 0 days.

(21) Appl. No.: 15/703,614

(22) Filed: Sep. 13, 2017

(65) Prior Publication Data

US 2018/0003767 A1 Jan. 4, 2018

Related U.S. Application Data

(63) Continuation-in-part of application No. PCT/EP2016/055228, filed on Mar. 11, 2016.

(30) Foreign Application Priority Data

Mar. 13, 2015 (IT) .............................. MI2015A0384

(51) Int. Cl.
*G01R 31/28* (2006.01)
*G01R 1/067* (2006.01)

(52) U.S. Cl.
CPC ....... *G01R 31/2891* (2013.01); *G01R 1/0675* (2013.01)

(58) Field of Classification Search
CPC .................................................... G01R 1/0675
See application file for complete search history.

(56) References Cited

U.S. PATENT DOCUMENTS 4,027,935 A 6/1977 Byrnes et al.
5,055,777 A 10/1991 Bonelli et al.
(Continued)

FOREIGN PATENT DOCUMENTS

DE 33 37 915 A1 5/1984
EP 0 068 270 A1 1/1983
(Continued)

*Primary Examiner* — Clayton E. LaBalle
*Assistant Examiner* — Jas A Sanghera
(74) *Attorney, Agent, or Firm* — Seed Intellectual Property Law Group LLP

(57) ABSTRACT

A testing head for testing a device includes a couple of plate-like supports separated from each other by a suitable gap and provided with respective guide holes to slidably house a plurality of contact probes, each including a rod-like body extending along a preset longitudinal axis between a first and second ends, the first end being a contact tip that abuts a contact pad of the device and the second end being a contact head that abuts a contact pad of a space transformer. At least one of the supports comprises a couple of guides that are parallel to each other and separated by an additional gap and provided with corresponding guide holes. Each contact probe comprises a protruding element or stopper originating from a lateral wall and realized in correspondence of one wall of a guide hole of the guides contacting the lateral wall of the contact probe.

41 Claims, 12 Drawing Sheets

(56) References Cited

U.S. PATENT DOCUMENTS

| | | |
|---|---|---|
| 5,800,184 A | 9/1998 | Lopergolo et al. |
| 6,150,830 A | 11/2000 | Schmid et al. |
| 8,222,912 B2 † | 7/2012 | Dang |
| 2005/0124144 A1 | 6/2005 | Sato |
| 2009/0102495 A1 | 4/2009 | Kister |
| 2010/0231249 A1 | 9/2010 | Dang et al. |
| 2014/0118016 A1 | 5/2014 | Breinlinger et al. |
| 2015/0015287 A1 | 1/2015 | DeBauche et al. |

FOREIGN PATENT DOCUMENTS

| | | |
|---|---|---|
| EP | 0 571 879 A2 | 12/1993 |
| EP | 1 243 931 A1 | 9/2002 |
| EP | 2 110 673 A1 | 10/2009 |
| EP | 2110673 A1 † | 10/2009 |
| GB | 2 086 670 A | 12/1982 |
| JP | 2008-139034 A | 6/2008 |
| JP | 2010-91335 A | 4/2010 |
| JP | 2013-257299 A † | 12/2013 |
| JP | 2013257299 A * | 12/2013 |
| WO | 2007/097559 A1 | 8/2007 |

\* cited by examiner
† cited by third party

TESTING HEAD COMPRISING VERTICAL PROBES

BACKGROUND

Technical Field

The present disclosure relates to a testing head comprising a plurality of vertical probes having an improved sliding movement within respective guide holes and correct holding within the head itself.

More specifically, the disclosure refers to a testing head comprising vertical probes for the functionality testing of an electronic device, the testing head comprising at least one couple of plate-like supports separated from each other by a suitable gap and provided with respective guide holes in order to slidably house a plurality of contact probes, each contact probe comprising a rod-like body extending according a preset longitudinal axis between a first and a second end, the first end being a contact tip adapted to abut onto a contact pad of a device under test, and the second end being a contact head adapted to abut onto a contact pad of a space transformer.

The disclosure relates in particular, but not exclusively, to a testing head for testing electronic devices integrated on semiconductor wafers and the following description is made with reference to this field of application with the only purpose of simplifying its exposition.

Description of the Related Art

As it is well known, a testing head (or probe head) is a device adapted to electrically connect a plurality of contact pads of a microstructure with corresponding channels of a testing machine that performs the functionality testing thereof, in particular the electrical one, or generically the test.

The test, which is performed on integrated circuits, is particularly useful to detect and isolate defective circuits already in the manufacturing step. Usually the testing heads are thus used to electrically test the circuits that are integrated on a wafer before cutting and assembling them inside a chip containment package.

A testing head generally comprises a plurality of movable contact elements or contact probes held by at least one couple of supports or guides, which are substantially plate-shaped and parallel to each other. Such plate-shaped supports are provided with suitable holes and arranged at a certain distance from each other in order to leave a free zone or gap for the movement and the possible deformation of the contact probes. The couple of plate-shaped supports includes in particular an upper plate-shaped support and a lower plate-shaped support, both provided with guide holes within which the contact probes axially slide, the probes being usually made of wires of special alloys having good electrical and mechanical properties.

The good connection between the contact probes and the contact pads of the device under test is ensured by pressing the testing head on the device itself, the contact probes, which are movable within the guide holes made in the upper and lower plate-shaped supports, undergoing a bending inside the gap between the two plate-shaped supports and a sliding within such guide holes during that pressing contact. Testing heads of this type, i.e. testing head with vertical probes, are usually called "vertical probe heads".

The testing heads with vertical probes typically have a gap within which a bending of the contact probes occurs, and such bending can be assisted by a suitable configuration of the probes themselves or of their supports, as schematically shown in FIG. 1, where for sake of illustration simplicity only one contact probe of the plurality of probes usually included in a testing head has been shown.

In particular, FIG. 1 schematically illustrates a testing head 1 comprising at least one lower plate-shaped support 2, usually indicated as "lower die", and one upper plate-shaped support 3, usually indicated as "upper die", having respective guide holes 4 and 5 within which at least one contact probe 6 slides.

The contact probe 6 terminates at one end with a contact tip 7 intended to abut onto a contact pad 8 of a device under test 10, so as to achieve the mechanical and electrical contact between said device under test 10 and a test apparatus (not shown) of which such testing head forms a terminal element.

Here and hereinafter the term "contact tip" means an end zone or region of a contact probe designed to contact the device under test or the testing apparatus, said contact zone or region being not necessarily sharpened.

In some cases, the contact probes are fixedly fastened to the head itself in correspondence of the upper plate-shaped support: such testing heads are referred to as "blocked probe testing heads".

More frequently, however, testing heads with unblocked probes, i.e. probes not fixedly fastened, are used, those probes being interfaced to a so-called board, possibly through a micro-contact board: such testing heads are referred to as non-blocked probe testing heads. The micro-contact board is usually called "space transformer" as, besides contacting the probes, it also allows to spatially redistribute the contact pads made on it with respect to the contact pads on the device under test, in particular relaxing the distance constraints between the centers of the pads themselves.

In this case, as illustrated in FIG. 1, the contact probe 6 has a further contact tip 15 towards a pad 11 of a plurality of contact pads of the space transformer 12. The good electrical contact between probes 6 and space transformer 12 is guaranteed in a similar manner to the contact with the device under test 10 by pressing the contact tips 15 of the contact probes 6 on the contact pads 11 of the space transformer 12.

The lower and upper plate-shaped supports 2 and 3 are suitably spaced by a gap 9 that allows the deformation of the contact probes 6. Finally, the guide holes 4 and 5 are sized so as to allow a sliding of the contact probe 6 therein.

The shape of the deformation undergone by the probes and the force required to produce such deformation are dependent on numerous factors, such as the physical characteristics of the alloy which makes the probes and the value of the offset between the guide holes in the upper plate-shaped support and the corresponding guide holes in the lower plate-shaped support.

The correct operation of a testing head is basically linked to two parameters: the vertical movement, or overtravel, of the contact probes and the horizontal movement, or scrub, of the contact tips of such contact probes. As is known, it is important to ensure the scrub of the contact tips so as to allow to scrub the surface of the contact pads, in this way removing the impurities that are for example in the form of a thin layer or oxide films, thus improving the contact carried out by the testing head.

All these features are evaluated and calibrated in the manufacturing step of a testing head in such a way that the good electrical connection between the probes and the device under test is always guaranteed. In the case of a testing head realized with the so-called "shifted plates" technology, the contact probes 6, which are also referred to as "buckling beam", are made straight, with a constant cross-section throughout their length, preferably rectangular, and usually they are sharpened at their ends in order to form the contact ends, in particular the contact tip 7 and the contact head 15 respectively, as shown in FIG. 1. It is known to manufacture this type of testing heads by superimposing the plate-shaped supports in order to place the respective guide holes in a mutual correspondence, to fit the contact probes in those guide holes, to space the plate-shaped supports to form the so-called gap and then to offset or to shift such supports, causing a deformation of the probe body, in a substantially central position, as shown in FIG. 1. These testing heads are also referred to as "shifted plate testing heads".

It is also well known that such testing heads with probes of the "buckling beam" type have considerable problems of friction of the contact probes within the respective guide holes, which can make it difficult or even prevent the sliding of the probes therein.

In extreme cases, such a friction can thus cause the probes to get stuck in the relative guide holes, in particular in correspondence of the contact points between the sides of the probe and the walls of the guide holes of the plate-shaped supports, for example during the vertical displacement or overtravel of the probe for the pressing contact of the contact tip on a contact pad of a device under test. Then undesirably, during the testing operations, a non optimal contact between the probe and the contact pad is obtained, with consequent efficiency problems of the electrical test carried out by the testing head as a whole.

The decrease of such sliding friction of the probes is in some cases achieved thanks to the use of a plurality of plate-shaped guides, preferably two guides, which are parallel to each other in order to form at least one of the plate-shaped supports of the head.

In such case, however, mechanisms are usually provided in order to prevent the probes from undesirably escaping from the testing heads, in particular during the absence of the device under test onto which the probes abut during the normal operation of the testing head.

A testing head comprising non-blocked probes comprising a coating having a transversal dimension greater than that of the guide holes of the lower plate-shaped support, so as to avoid the fall by gravity of the contact probes, is described for example in U.S. Pat. No. 6,150,830 to Schmid et al. Other holding systems of the probes are described in the German patent application No. DE-A-3337915 in the name of Feinmetall GmbH and in US patent application published with No. US 2014/0118016 to Breinlinger et al., as well as in European patent application No. EP 2110673 in the name of the Applicant itself.

Although advantageous under several aspects, the known solutions have some drawbacks; in particular, some of the testing heads made according to the known art are not yet able to prevent the probes from escaping from the guide holes, while other solutions introduce problems due to the probes getting stuck inside the guide holes, in particular during the movement in a direction orthogonal to the device under test of the respective contact tips. In yet other cases, the overall dimension of the probes is increased in an unacceptable way.

The technical problem of the present disclosure is thus to provide a testing head for microstructures having functional and structural characteristics such to allow the minimization of the friction forces existing between the lateral walls of the contact probes and the walls of the corresponding guide holes of the upper and lower supports, while ensuring a correct holding of the probes inside the testing head, so as to overcome the limits and drawbacks currently affecting the testing heads for microstructures made of the known art.

BRIEF SUMMARY

One or more embodiments of the present disclosure realize a testing head comprising vertical probes and having at least one upper or lower support comprising a plurality of parallel guides apt to improve the sliding of the contact probes within respective guide holes, as well as at least one element protruding from the body of such probes, which is also referred to as a stopper and is suitably positioned with respect to the supports so as to prevent the probes from escaping from the testing head also in the absence of a pressing contact with a device under test or with a space transformer.

One or more embodiments of the present disclosure provide a testing head with vertical probes for the functionality testing of an electronic device, the testing head comprising at least one couple of plate-like supports separated one from the other by a suitable gap and provided with respective guide holes in order to slidably house a plurality of contact probes, each contact probe comprising a rod-like body extending along a preset longitudinal axis between a first and a second end, the first end being a contact tip adapted to abut onto a contact pad of a device under test and the second end being a contact head adapted to abut onto a contact pad of a space transformer, characterized in that at least one of such supports comprises at least one couple of guides that are parallel to each other and separated by an additional gap and provided with corresponding guide holes and in that each contact probe comprises at least one protruding element or stopper protruding from one of its lateral walls, that lateral wall contacting one wall of at least one of the guide holes of the guides.

More in particular, the disclosure comprises the following additional and optional characteristics, taken alone or in combination if needed.

According to another aspect of the disclosure, the contact head can have a diameter greater than a diameter of the guide holes of the guides, thus preventing the contact head from passing through the guide holes.

In particular, the stopper can be realized between the at least one support and further support, near the at least one support.

Alternatively, the stopper can be realized between the guides of the at least one support, in the additional gap.

According to another aspect of the disclosure, the contact probe can comprise a further stopper protruding from the same wall from which the at least one stopper protrudes.

Alternatively, the contact probe can comprise a further stopper protruding from an opposite wall with respect to the wall from which the at least one stopper protrudes.

The contact probe can also comprise at least further three stoppers, these four stoppers being protruding in couples from the walls of the contact probe and being arranged symmetrically to the longitudinal axis, a first and a third stopper being arranged between the at least one support and the further support, and a second and a fourth stopper being positioned between the guides of the at least one support.

According to another aspect of the disclosure, the contact probe can further comprise a notch realized in a wall of the contact probe opposite to the wall from which the at least one stopper protrudes.

In particular, the notch can realize a recess in the rod-like body of the contact probe having dimensions comparable to a lateral protrusion of the at least one stopper.

According to another aspect of the disclosure, the at least one stopper can have a lateral protrusion having dimensions comparable to a diameter of the contact probe and can be preferably between 5 and 40 µm.

According to yet another aspect of the disclosure, the at least one stopper can be arranged at a distance from the at least one support less than the sum of a length of the contact tip, protruding outside of the testing head from the further support, and a thickness of the further support.

Finally, according to another aspect of the disclosure, the at least one stopper may further comprise at least one undercut wall having a rounded shape.

In particular, such undercut wall can have a radius of curvature with between 0.001 µm and 0.1 µm.

The technical problem is also solved by a method for assembling a testing head as defined above, the method comprising at least the steps of:

overlapping a lower support and a first and second guide of an upper support having the respective guide holes concentric to each other;
  inserting the contact probes into the respective aligned guide holes;
  first relative movement of the upper support, and in particular of the guides together, with respect to the lower support along a first direction, substantially perpendicular to the supports, passing the stopper through the corresponding guide holes of the upper support; and
  second relative movement of the upper support, and in particular of the guides together, with respect to the lower support along a second direction, substantially parallel to the supports.

According to another aspect of the disclosure, the method can further comprise a third step of relative movement of the first and second guide of the upper support with respect to each other along a third direction, parallel to the guides.

The characteristics and the advantages of the testing head of the disclosure will be apparent from the following description of an embodiment thereof, given by way of an indicative and non-limiting example with reference to the accompanying drawings.

DETAILED DESCRIPTION

Figure 2A:
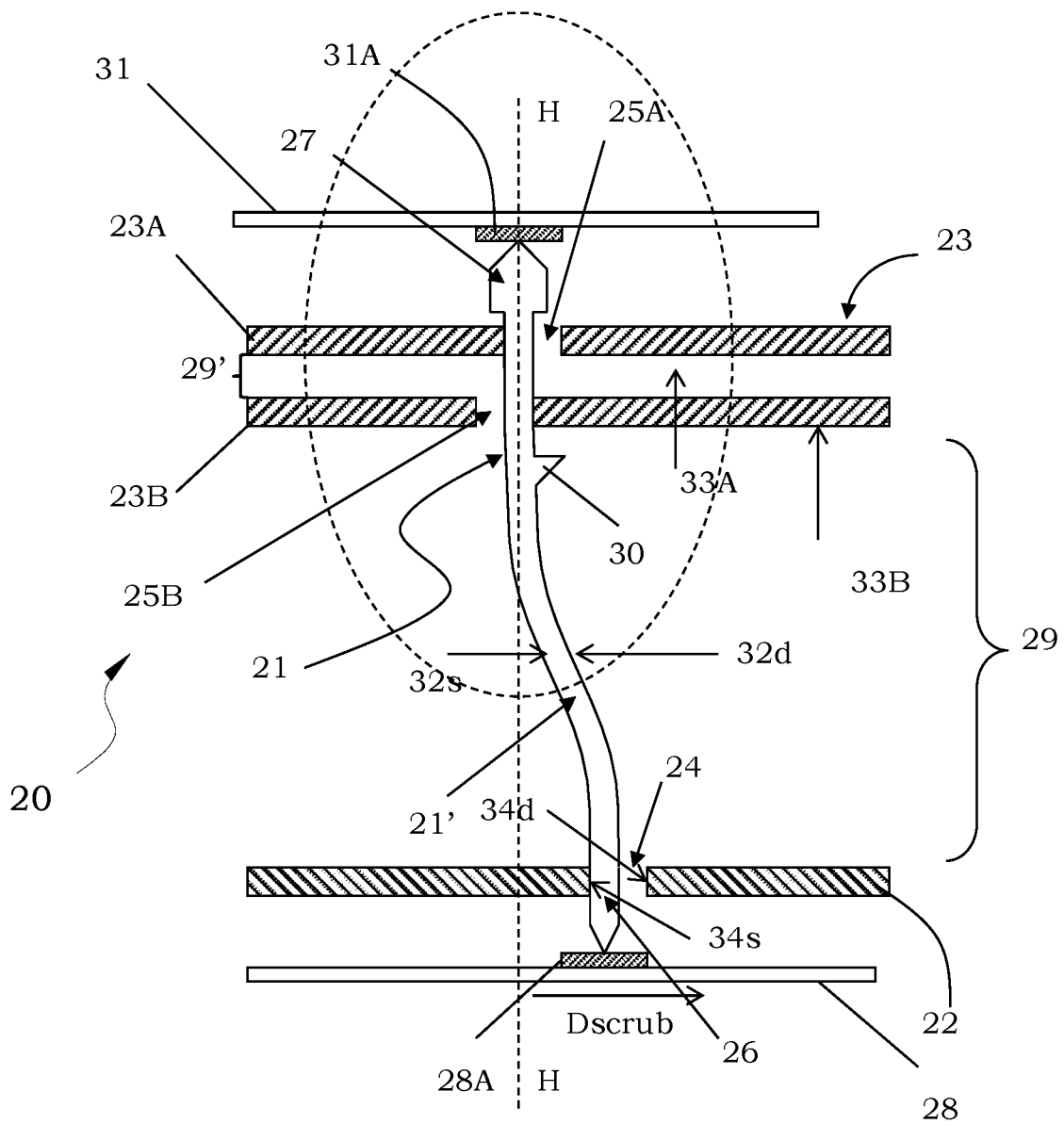
FIGS. 2A-2B schematically show an embodiment of the testing head according to the disclosure, in different operating conditions.

With reference to such Figures, and in particular to FIG. 2A, a testing head realized according to the disclosure is described, the testing head being globally indicated as 20.

It should be noted that the Figures represent schematic views and are not drawn to scale, but instead they are drawn so as to emphasize the important features of the disclosure.

Additionally, in the Figures, the different pieces are shown schematically, as their shape can vary depending on the desired application.

Figure 1:
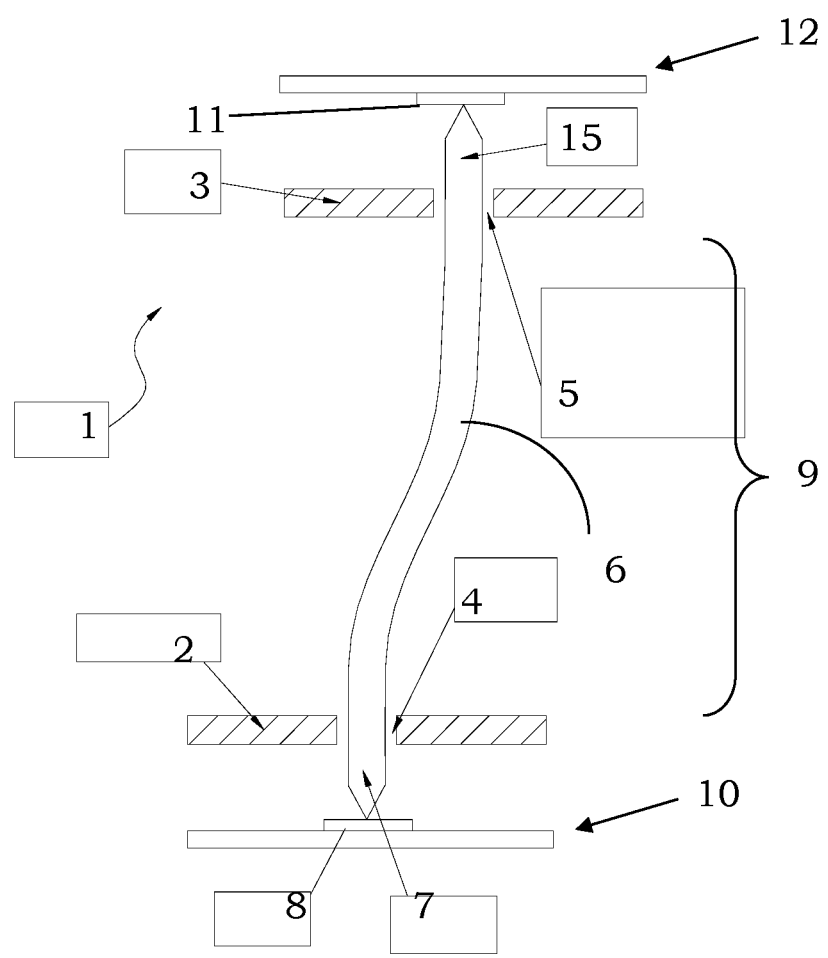
FIG. 1 schematically shows a testing head realized according to the prior art.

In a similar manner to the testing head 1 realized according to the prior art and illustrated in FIG. 1, the testing head 20 comprises a lower support 22, usually indicated as "lower die", and an upper support 23, usually indicated as "upper die"; as above, they are plate-shaped supports spaced apart by a suitable gap 29 and provided with respective guide holes within which a plurality of contact probes is slidingly housed.

For sake of illustration simplicity and clarity, in the Figures only one contact probe 21 is shown, that contact probe 21 comprising a rod-like body 21' having a predetermined longitudinal axis HH and axially sliding in the guide holes of the upper 23 and lower 22 supports, the rod-like body 21' ending with a first contact end or tip 26 and with a second contact end or head 27. More particularly, the contact tip 26 is apt to abut onto contact pads 28A of a device under test 28. In the example illustrated in FIG. 2A, the testing head 20 is a non blocked probe testing head, i.e. the probes are not fixedly fastened, and the contact head 27 is apt to abut onto contact pads 31A of a space transformer 31.

In the case of testing heads for testing circuits that are integrated on wafers, it is known to use contact probes having a length between 2 mm and 9 mm. It is also known to use probes having a polygonal cross section, preferably rectangular or square; typical values of the section range from 10×10 microns to 50×140 microns.

Suitably, at least one of the lower or upper support comprises a plurality of plate-shaped guides parallel to each other, in order to facilitate the sliding of the contact probes 21 within the respective guide holes and to reduce the problems of probes getting stuck during their displacement due to the pressing contact of the respective contact tips 26 on the contact pads 28A of the device under test 28. In the example of FIG. 2A, the upper support 23 comprises in particular at least one first and one second guide, 23A and 23B, which are parallel to each other are separated by an additional gap 29' and are provided with corresponding guide holes 25A and 25B for housing the contact probes 21. In similar manner, the lower support 22 comprises a plurality of guide holes 24 for housing the contact probes 21.

It is noted that the upper support 23 and the lower support 22 are mutually shifted so as to realize the desired deformation of the body 21' of the contact probe 21; furthermore, also the first guide 23A and the second guide 23B of the upper support 23 are mutually shifted in order to achieve the desired holding of the probes inside the testing head 20. As already mentioned in relation to the prior art, the holding of the contact probes 21 realized by the relative displacement (shift) of the guides 23A and 23B of the upper support 23 is not however able to prevent the contact probes 21 from sliding outside the testing head 20 in the absence of a device under test 28 or of a space transformer 31.

Moreover, the shift of the upper support 23 and the lower support 22 determines a direction of deformation of the contact probe 21 and thus the direction of movement of the relative contact tip 26 on the contact pad 28A of the device under test 28, indicated as scrub direction Dscrub in the Figure.

Such shift causes at least one first wall 32s of the contact probe 21 to contact a corresponding wall 34s of a lower guide hole 24 made in the lower support 22, a play being defined between a second wall 32d of the contact probe 21 and an opposite wall 34d of the lower guide hole 24, the amplitude of the play being determined by the size of the guide holes 24 of the lower support 22 with respect to a diameter of the contact probe 21, the word diameter meaning here and hereinafter the maximum transverse dimension, also in the case of probes with non-circular section.

It is noted that the first wall 32s of the contact probe 21 is in particular a wall that precedes the longitudinal axis HH of the probe itself with respect to the scrub direction Dscrub, while the second wall 32d of the contact probe 21 is a wall that follows this axis HH along the scrub direction Dscrub.

Figure 3:
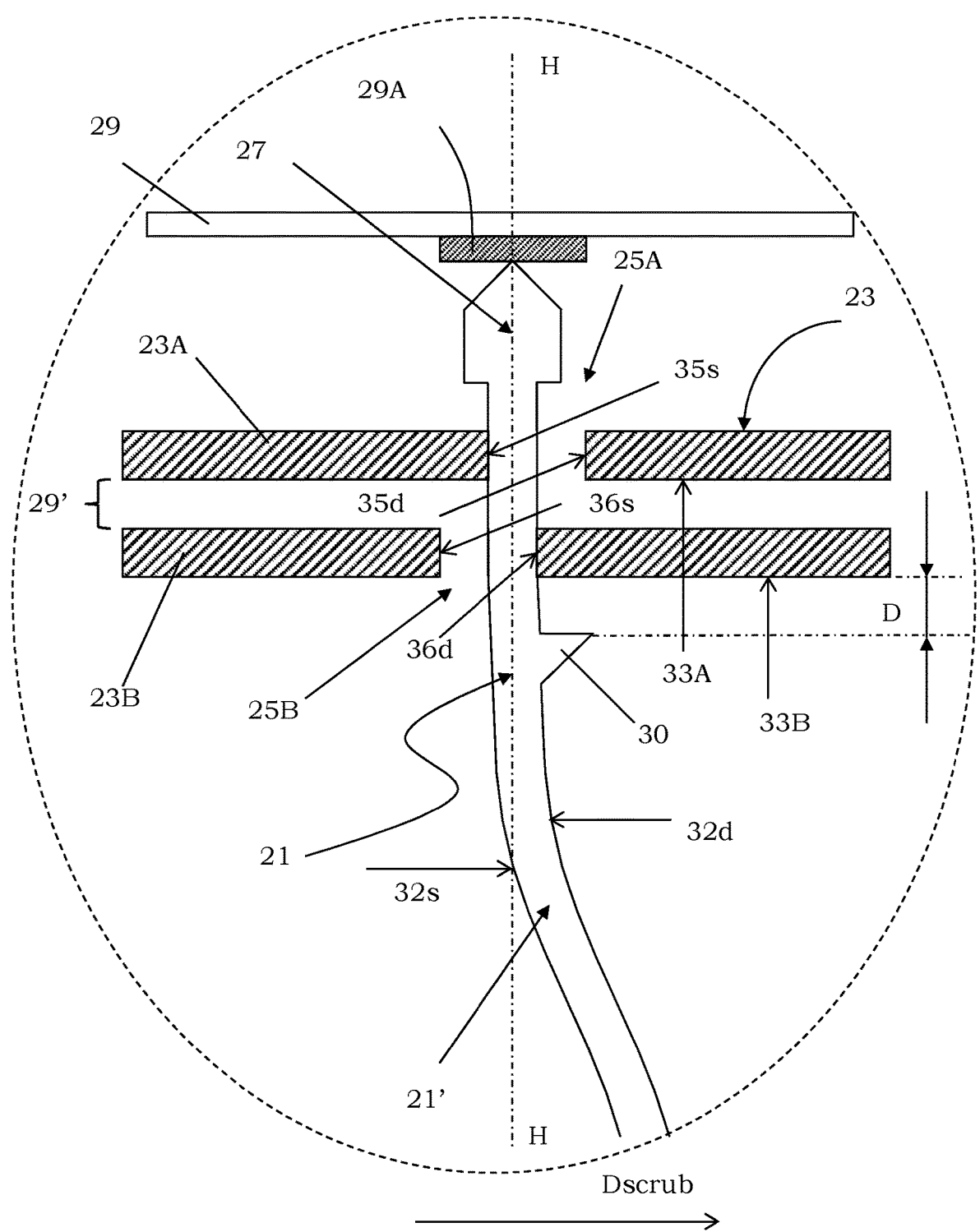
FIG. 3 schematically shows an enlarged view of a detail of the testing head of FIG. 2A.

Additionally, the shift of the upper support 23 and the lower support 22, as well as the shift of the first guide 23A and the second guide 23B of the upper support 23, causes the first wall 32s of the contact probe 21 to contact a wall 35s of the guide hole 25A made in the first guide 23A of the upper support 23 and causes the second wall 32d of the contact probe 21 to contact a wall 36d of the guide hole 25B of the second guide 23B of the upper support 23, as shown in enlarged scale in FIG. 3.

More particularly, the first wall 32s of the contact probe 21 is in contact with the wall 35s of the guide hole 25A, the wall 35s preceding the axis HH along the scrub direction Dscrub, while the second wall 32d of the contact probe 21 is in contact with the wall 36d of the guide hole 25B, the wall 36d following the axis HH along the scrub direction Dscrub.

Even in such a case, respective plays are defined between the second wall 32d of the contact probe 21 and an opposite wall 35d of the guide hole 25A of the first guide probe 23A of the upper support 23, as well as between the first wall 32s of the contact probe 21 and an opposite wall 36s of the guide hole 25B of the second guide 23B of the upper support 23, such plays having amplitudes depending on the sizing of the guide holes 25A and 25B made in the first and second guide 23A and 23B of the upper support 23 and on the diameter of the contact probe 21 housed therein.

More particularly, the wall 35d of the guide hole 25A of the first guide 23A is the one that follows the axis HH along the scrub direction Dscrub, while the wall 36s of the guide hole 25B of the second guide 23B is the one that precedes the axis HH along the scrub direction Dscrub.

Advantageously according to the present disclosure, the contact probe 21 further comprises at least one element protruding from the body 21', in correspondence of the first wall 32s or of the second wall 32d of the contact probe 21. This protruding element is apt in particular to realize stop means (or abutment means) of the contact probe 21, so as to prevent the contact probe 21 from escaping from the testing head 20 even in the absence of a device under test 28 or of a space transformer 31, and it will be indicated in the following as stopper 30. Suitably, the stopper 30 is integral with the body 21' of the contact probe 21.

In particular, the stopper 30 is able to prevent an upward movement (in the local reference system of FIG. 2A) of the corresponding contact probe 21.

Figure 2B:
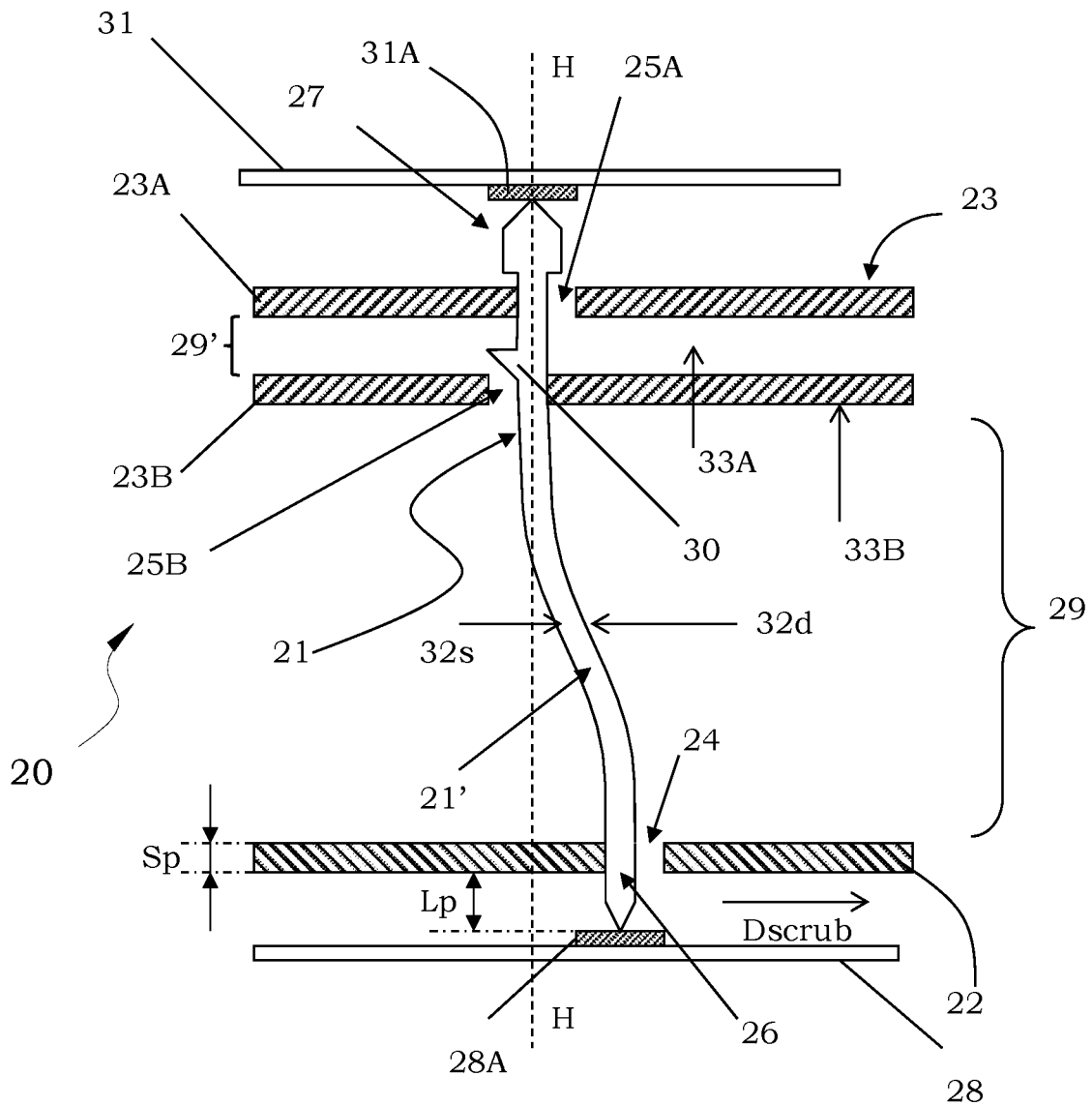

In the embodiments shown in FIGS. 2A, 2B, the stopper 30 has the shape of a tooth, which is integral with the body 21' of the contact probe 21 and protrudes from the body 21' as a lateral lug (or protrusion) having a size comparable to the diameter of the contact probe 21 and in particular comprised between 5 and 40 μm, the term comparable meaning that the gap between such lateral dimension and the diameter of the contact probe 21 is less than 20%.

In the embodiment illustrated in FIG. 2A, the stopper 30 is arranged so as to protrude from the second wall 32d of the contact probe 21 and is disposed between the second guide 23B of the upper support 23 and the lower support 22, in particular in close proximity to the second guide 23B. More particularly, during the normal operation of the testing head 20, the stopper 30 is not in contact with the upper support 23, so as not to interfere with the movement of the corresponding contact probe 21. The stopper 30 acts only on the occasion of any upward movement of the contact probe 21, for example in case of a removal of the space transformer 31 and of an undesired but temporary "gluing" between the contact heads 27 of the probes and the contact pads 31A of the space transformer 31.

Furthermore, the contact head 27 is realized so as to have a diameter larger than the diameter of the guide holes formed in the upper support 23, preventing a downward sliding (in local reference system of the FIG. 2A) of the corresponding contact probe 21. Even in such a case, the term diameter, here and in the following means a maximum transverse dimension, even in case of non-circular holes.

In this way, the stopper 30 is arranged at the wall 36d of the guide hole 25B of the second guide 23B of the upper support 23, that wall 36d abutting onto the second wall 32d of the contact probe 21 from which the stopper 30 protrudes, ensuring, in combination with the contact head 27, the desired holding of the contact probe 21 inside the testing head 20 even in absence of a device under test 28 or of a space transformer 31. In particular, the contact head 27 is sized so as to have a dimension (i.e. its diameter) greater than the diameter of the guide holes 25A, 25B realized in the guides 23A, 23B of the upper support 23, thereby preventing a passage of the contact head 27 itself through those holes. Additionally, it is noted that the stopper 30 is able to prevent unwanted movements of the contact probes 21 during cleaning operations of the testing head 20, the cleaning operations being usually made, as it is well known, by powerful air jets, which are able in particular to move the contact probes. Finally, the presence of the stopper 30 ensures the retention of the contact probes 21 within the testing head 20, also when removing the space transformer 31 with breakage of possible oxides that retain the contact heads 27 at the contact pads 31A of the space transformer 31 itself.

In an alternative embodiment illustrated in FIG. 2B, the stopper 30 is realized in such a way that it protrudes from the first wall 32s and is positioned between the first guide 23A and the second guide 23B of the upper support 23, in particular in the additional gap 29' and further close to the first guide 23A. More in particular, in case of an unwanted upward movement of the contact probe 21, for example due to the removal of the space transformer 31, the stopper 30 is apt to abut onto the undercut wall 33A of the first guide 23A of the upper support 23.

In other words, the stopper 30 is positioned below the first wall 35s of the guide hole 25A of the first guide 23A of the upper support 23, the wall 35s abutting onto the first wall 32s of the contact probe 21 from which the stopper 30 protrudes, ensuring, in combination with the contact head 27, the desired holding of the contact probe 21 inside the testing head 20 even in absence of a device under test 28 or of a space transformer 31.

It is noted that the arrangement of the stopper 30 between the first and the second guide 23A and 23B of the upper support 23, i.e. in the additional gap 29', is particularly advantageous since the additional gap 29' is an area with reduced stresses, in particular almost free from bending, which bending instead affects the portion of the contact probe 21 disposed in the gap 29, that is, between the second guide 23B of the upper support 23 and the lower support 22.

In this way, there is no risk of triggering unwanted breakages at the stopper 30, whose shape protruding from the wall of the contact probe 21 unavoidably leads to the presence of stress points. According to this embodiment, the stopper 30 is then made in a "stable" portion of the contact probe 21, in particular in a zone with controlled mechanical stress due to the reduced possibility of movement of the probe itself.

The testing head 20 comprises at least one contact probe 21 provided with at least one stopper 30 arranged at the bottom of at least one guide 23A, 23B, respectively, of the upper support 23 at a wall, 32s, 32d, respectively, of the contact probe 21, the wall of the probe being in contact with a corresponding wall, 35s, 36d, respectively, of a guide hole, 25A, 25B, respectively, realized in that guide. More particularly, the stopper 30 is apt to abut onto an undercut wall, 33A, 33B, of the respective guide, 23A, 23B, of the upper support 23 under which it is positioned, in correspondence of a wall 32s, 32d, of the contact probe 21, the wall of the probe abutting onto a wall 35s, 36d, of the respective guide holes 25A, 25B, of the first and second guide 23A, 23B.

As mentioned above, when the stopper 30 is positioned between the second guide 23B of the upper support 23 and the lower support 22, it protrudes from the second wall 32d of the contact probe 21, and it is located at the wall 36d of the guide hole 25B, that wall following the axis HH along the scrub direction Dscrub, while when the stopper 30 is positioned between the first guide 23A and the second guide 23B of the upper support 23, it protrudes from the first wall 32s of the contact probe 21, and it is located at the wall 35s of the guide hole 25A, that wall preceding the axis HH along the scrub direction Dscrub.

Figure 4A:
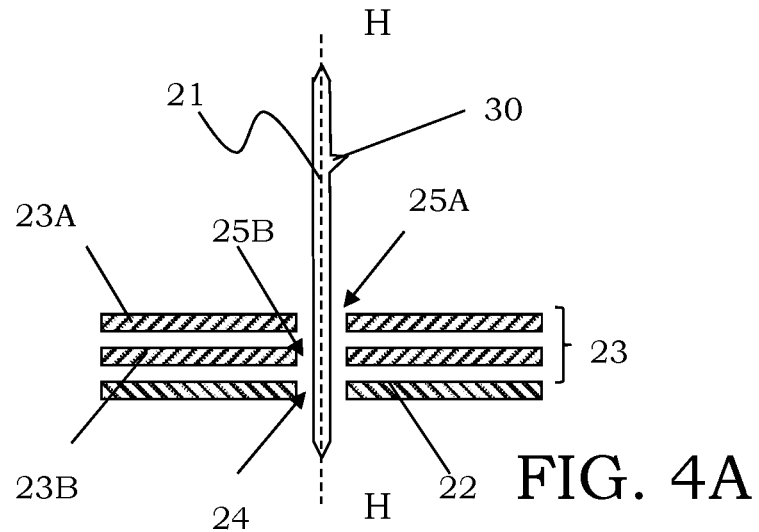
FIGS. 4A-4C show successive steps of assembly of a testing head according to the present disclosure.

It should be noted that the guide holes 25A, 25B realized in the guides 23A and 23B of the upper support 23 are suitably sized so as to allow the passage of the contact probe 21 also in correspondence of the stopper 30. In this way it is possible to assembly in an extremely simple way the testing head 20, as schematically shown in FIGS. 4A-4C.

In particular, in a first assembly step, the lower support 22 and the first and second guide 23A, 23B of the upper support 23 are overlapped so that the respective guide holes 24, 25A, 25B are concentric to each other; this overlap is followed by the insertion of the contact probes 21 in the respective guide holes. In particular, in the example illustrated in FIGS. 4A-4C, a testing head with vertical probes 20 and shifted plates is considered, in which the contact probes 21 do not initially have any pre-deformation, as shown in FIG. 4A. It is obviously possible to use the following described method for assembling a testing head also in case of previously deformed probes.

Figure 4B:
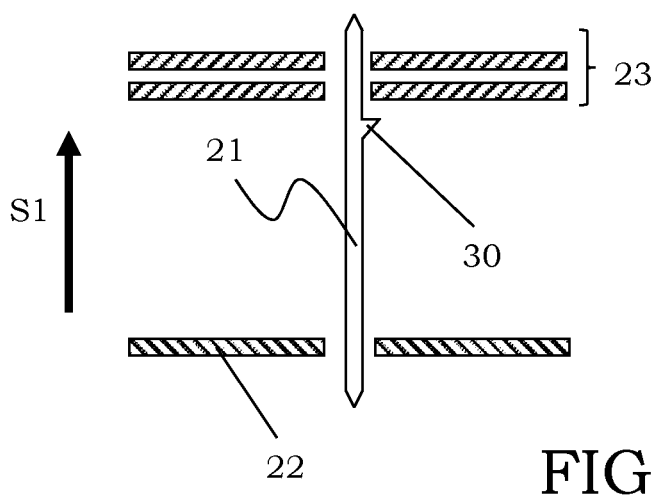
Figure 4C:
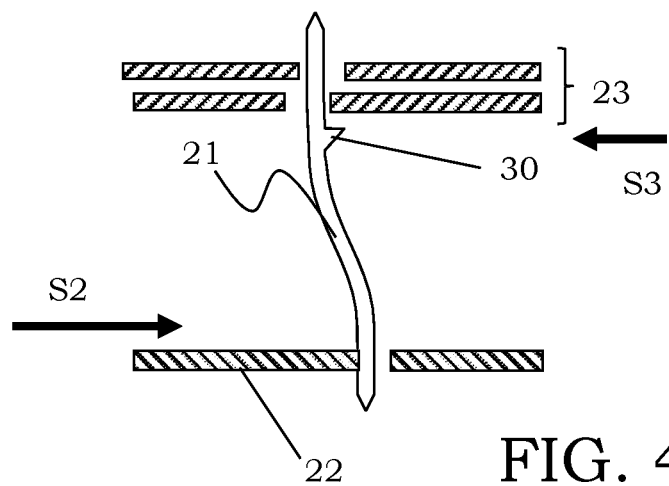

The method also comprises a first step of relative movement of the lower support 22 and upper support 23, along a first direction S1, substantially perpendicular to the supports, and then to the device under test (not shown), that direction being indicated by an arrow in FIG. 4B. In particular, the upper support 23, and in particular its guides 23A and 23B together, is removed from the lower support 22 along the direction S1.

As already pointed out, at least the guide holes 25A, 25B of the guides 23A, 23B of the upper support 23 are then suitably sized to allow the passage of the contact probes 21 provided with the stopper 30. More particularly, the guide holes 25A, 25B are realized with a diameter corresponding to the sum of the diameter of the contact probe 21 and of the lateral dimension of the stopper 30, in addition to a value that takes into account the process tolerances.

Finally, the method comprises a step of relative movement of the lower support 22 and the upper support 23 along a second direction S2, which is substantially parallel to the supports, and then to the device under test (not shown), that direction being indicated by an arrow in FIG. 4C. In particular, the upper support 23, and in particular its guides 23A and 23B together, are shifted along the direction S2 with respect to the lower support 22, causing a deformation of the body 21' of the contact probe 21. It is obviously possible to realize a different, in particular opposite and symmetrical, deformation of the body 21' of the contact probe 21 with a shift of the upper support 23 and lower support 22 in an opposite direction with respect to the direction S2 shown in the Figure. In this case also the positioning of the stopper 30 must be symmetrical, however in such a way that it protrudes from a wall of the contact probe 21 in contact with a wall of a corresponding overlying guide hole.

Furthermore, the first and second guide 23A and 23B of the upper support 23 are shifted relatively to each other according a third direction S3, always parallel to the guides and indicated by a further arrow in FIG. 4C. In this way, it is guaranteed a local holding of the contact probe 21 within the guide holes 25A, 25B of the guides 23A, 23B of the upper support 23.

As already indicated, this local holding of the contact probe 21 is, however, not sufficient to maintain in position the contact probe 21 in the absence of the device under test 28 or of the space transformer 31, onto whose pads the respective contact tip 26 and contact head 27 abut.

Suitably, at least one stopper 30 is provided protruding from the body 21' of the contact probe 21 which, in cooperation with a sizing of the contact head 27 having a diameter greater than the diameter of the guide holes 25A made in the first guide 23A of the upper support 23, prevents the contact probe from slipping out of the testing head 20 even in the absence of a device under test 28 or of a space transformer 31 having contact pads abutting respectively onto the contact tip 26 and onto the contact head 27 of that contact probe 21. Even in this case, during the normal operation of the testing head 20, the stopper 30 is not in contact with the upper support 23 and does not interfere with the movement of the contact probe 21.

Figure 5A:
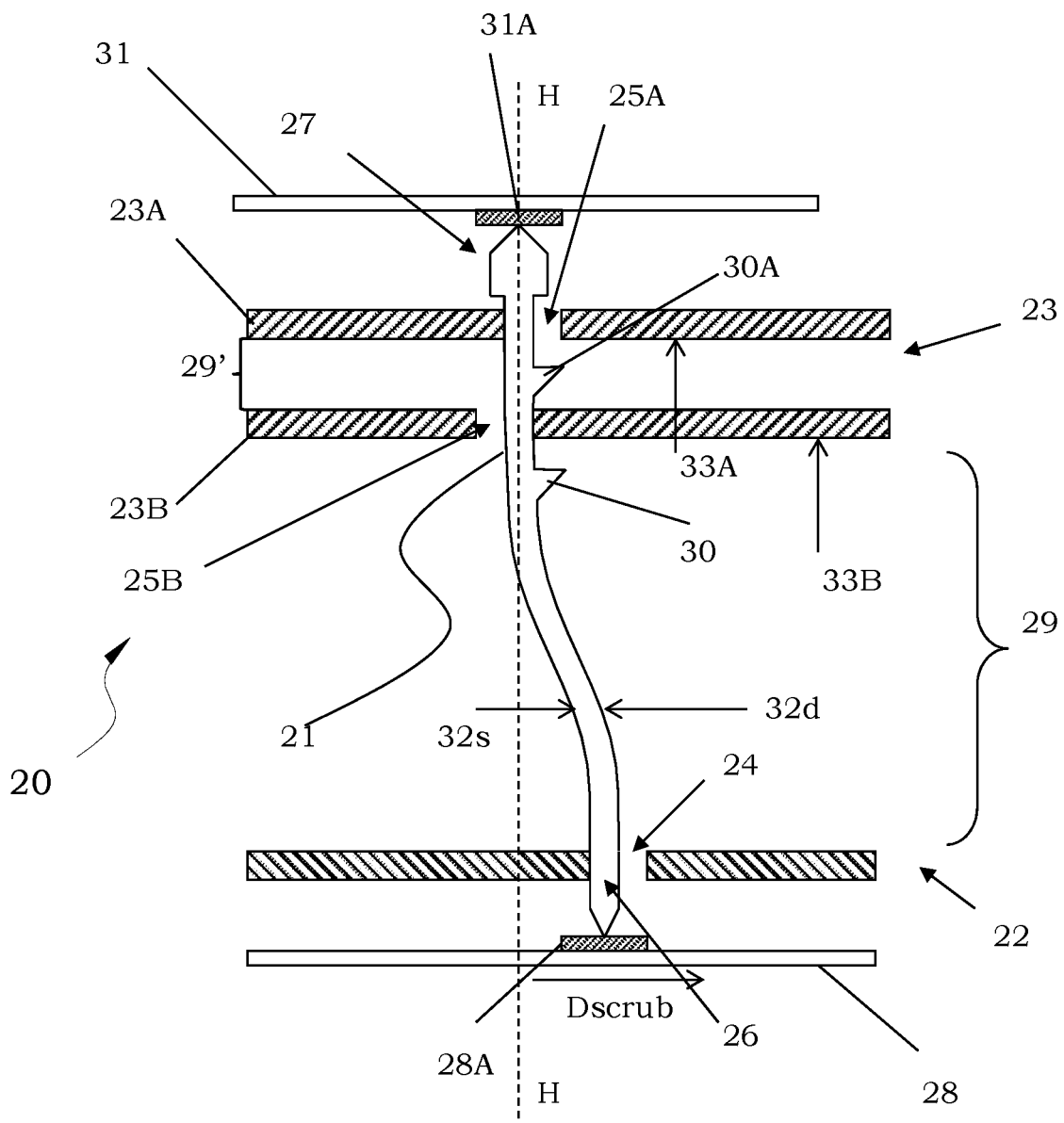
FIGS. 5A-5B, 6A-6B, 7 and 8 schematically show alternative embodiments of the testing head according to the disclosure.
Figure 5B:
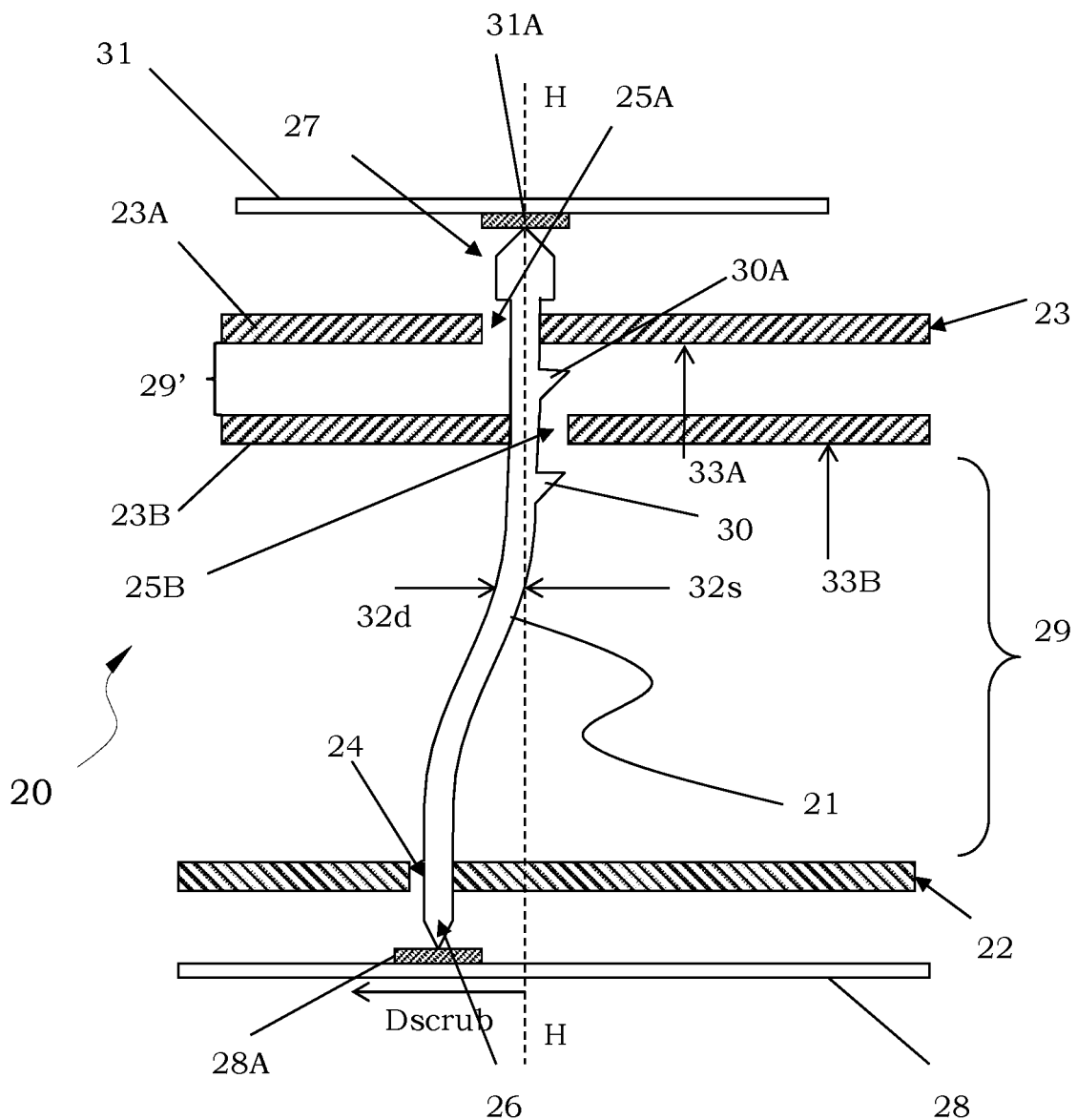

According to an alternative embodiment illustrated in FIGS. 5A and 5B, the testing head 20 comprises at least one contact probe 21 with the stopper 30 protruding from the second wall 32d of the contact probe 21, the wall 32d abutting onto the wall 36d of the guide hole 25B of the second guide 23B of the upper support 23, overlying the stopper 30, and positioned between the second guide 23B of the upper support 23 and the lower support 22, as well as provided with a further stopper 30A protruding from the same second wall 32d and positioned between the first guide 23A and the second guide 23B of the upper support 23.

In this way, in fact, at least one of the stoppers 30 and 30A is prevented from moving through the guide holes since it is in correspondence of a guide hole wall in contact with a wall of the contact probe 21, irrespective of the bending of the probe itself, commonly referred to as assembly angle of the probe.

In particular, the contact probe 21 can have a bending causing its contact tip 26 to move to the right with respect to its contact head 27, as in the example of FIG. 5A, or to the left, as in the example of FIG. 5B; in other words, this embodiment can be used for both the assembly angles of the contact probe 21, while the embodiments illustrated in FIGS. 2A and 2B can be used each for a specific assembly angle of the contact probe 21.

Furthermore, the stoppers 30 and 30A introduce a lateral protrusion in a same direction, thus ensuring to minimize the minimum diameter value which is necessary to provide for realizing the guide holes 25A, 25B of the guides 23A and 23B of the upper support 23, in order to ensure the correct passage of the contact probe 21 using the assembly method illustrated with reference to FIGS. 4A-4C.

More particularly, in the embodiment of FIG. 5A, on the occasion of a possible upward movement of the contact probe 21, the stopper 30 acts abutting onto the undercut wall 33B of the second guide 23B of the upper support 23, while in the embodiment of FIG. 5B the further stopper 30A acts abutting onto the undercut wall 33A of the first guide 23A of the upper support 23.

Figure 6A:
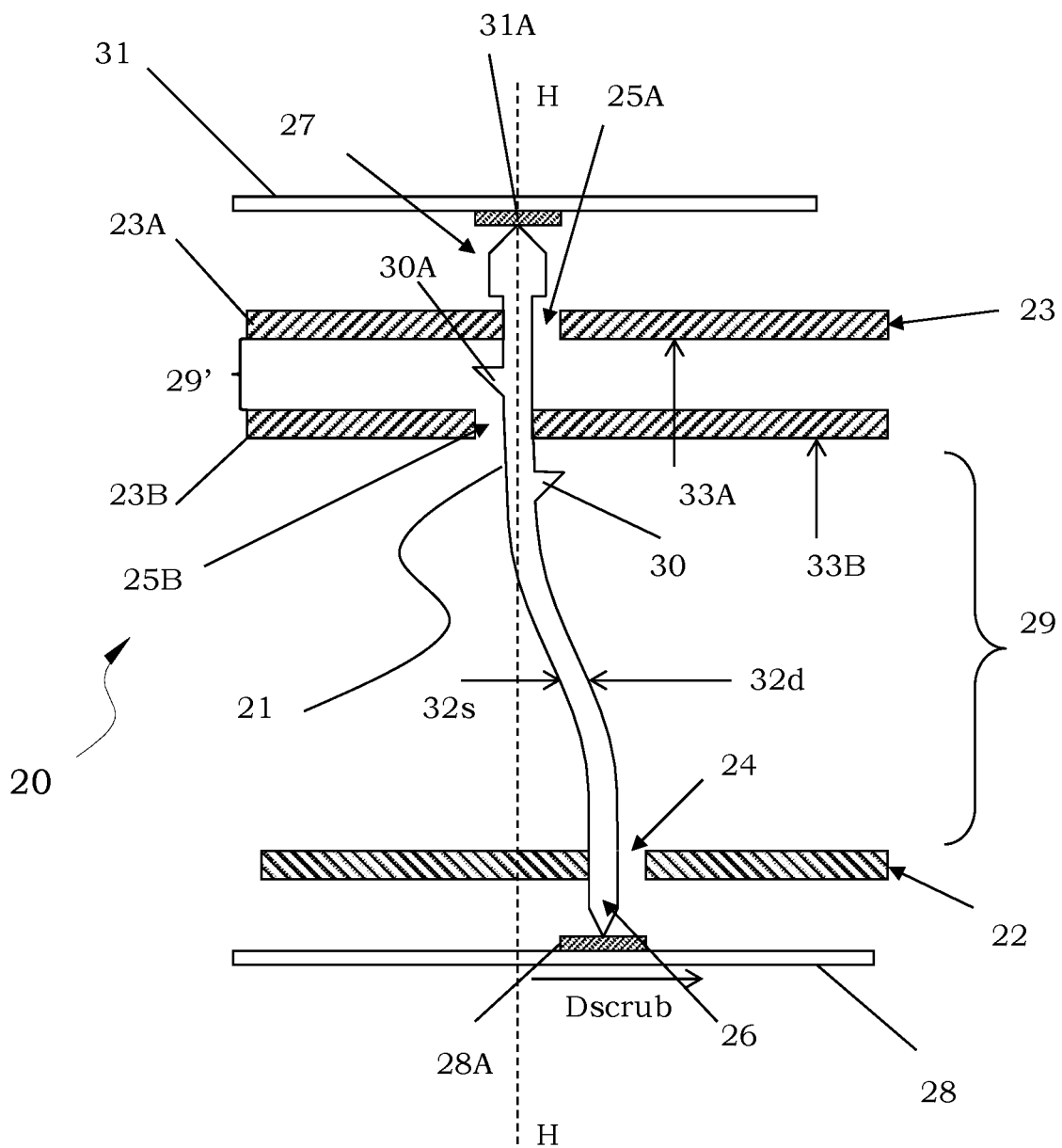
Figure 6B:
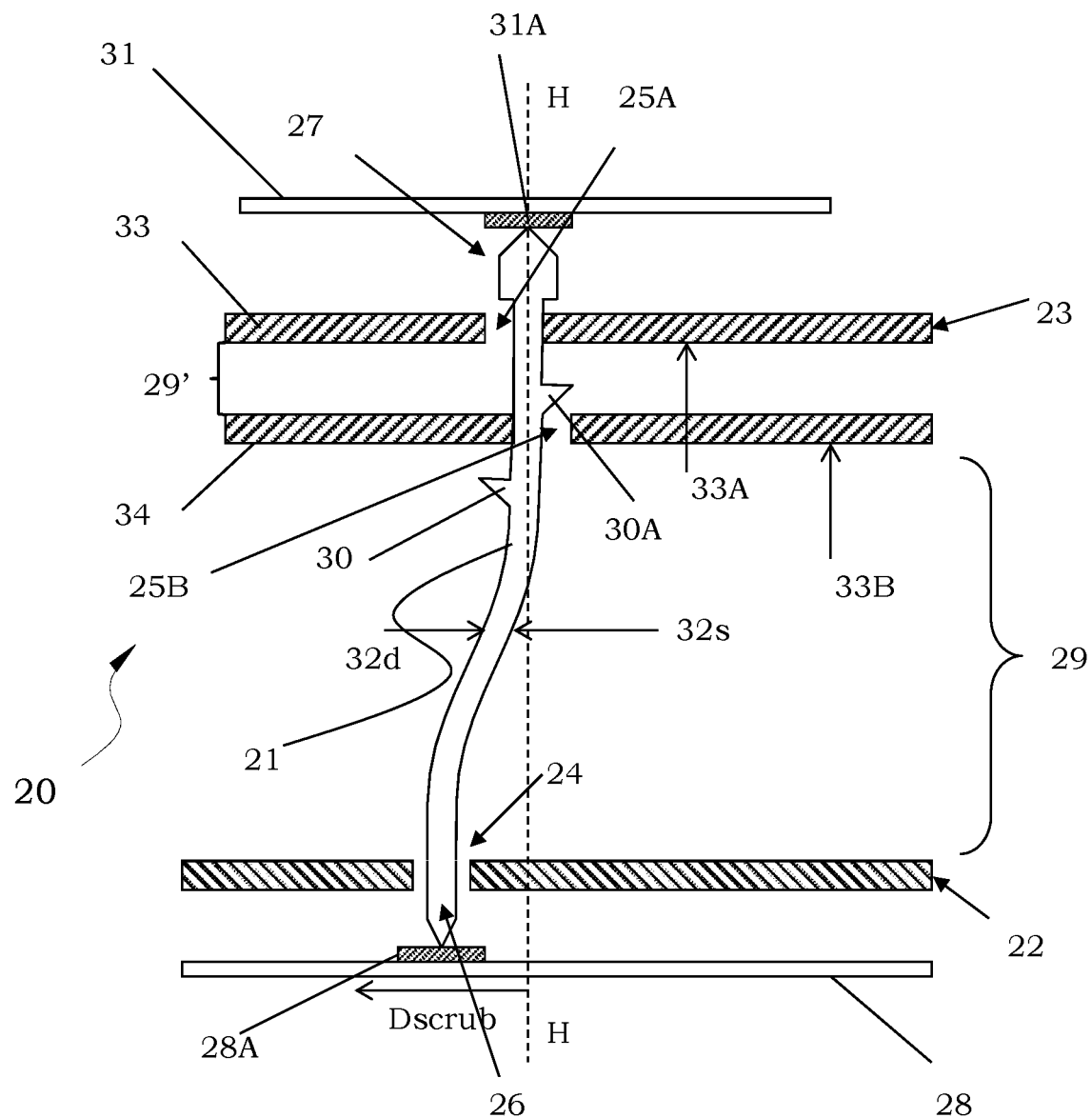

It is also possible to realize the further stopper 30A in such a way that it protrudes from a different wall with respect to the stopper 30, as shown schematically in FIGS. 6A and 6B.

In particular, as in the embodiment of FIG. 6A, the testing head 20 comprises at least one contact probe 21 provided with the stopper 30 protruding from the second wall 32d of the contact probe 21 and provided with the further stopper 30A protruding from the first wall 32s of the contact probe 21. In particular, the stopper 30 is arranged between the second guide 23B of the upper support 23 and lower support 22, while the further stopper 30A is arranged between the first guide 23A and the second guide 23B of the upper support 23.

In such a configuration, both stoppers 30 and 30A are arranged at the wall of the contact probe 21, i.e. the wall 32d and 32s, respectively, those walls being in contact with the wall 36d, 35s, respectively, of the guide hole above them, 25B, 25A respectively, and then provide an improved holding of the contact probe 21 within the testing head 20, even in absence of a device under test 28 or of a space transformer 31.

It is noted that the same embodiment is illustrated in FIG. 6B, in presence of an opposite scrub direction Dscrub. Remembering that the first wall 32s of the contact probe 21 is the wall that precedes the axis HH with respect to the scrub direction Dscrub and that the second wall 32d is the wall that follows such axis HH along the scrub direction Dscrub, also in this case the testing head 20 comprises at least one contact probe 21 provided with the stopper 30 protruding from the second wall 32d of the contact probe 21 and provided with the further stopper 30A protruding from the first wall 32s of the contact probe 21. In particular, the stopper 30 is arranged between the second guide 23B of the upper support 23 and the lower support 22, while the further stopper 30A is arranged between the first guide 23A and the second guide 23B of the upper support 23.

Even in this case, both stoppers 30 and 30A are arranged in correspondence of the wall of the contact probe 21, i.e. the wall 32d, 32s, respectively, those walls being in contact with the wall 36d, 35s, respectively, of the guide hole above them, 25B, 25A, respectively, and thus ensure an improved holding of the contact probe 21 inside the testing head 20.

It is evident that also the embodiments of FIGS. 6A and 6B can be used each for a different assembly angle of the contact probe 21.

Figure 7:
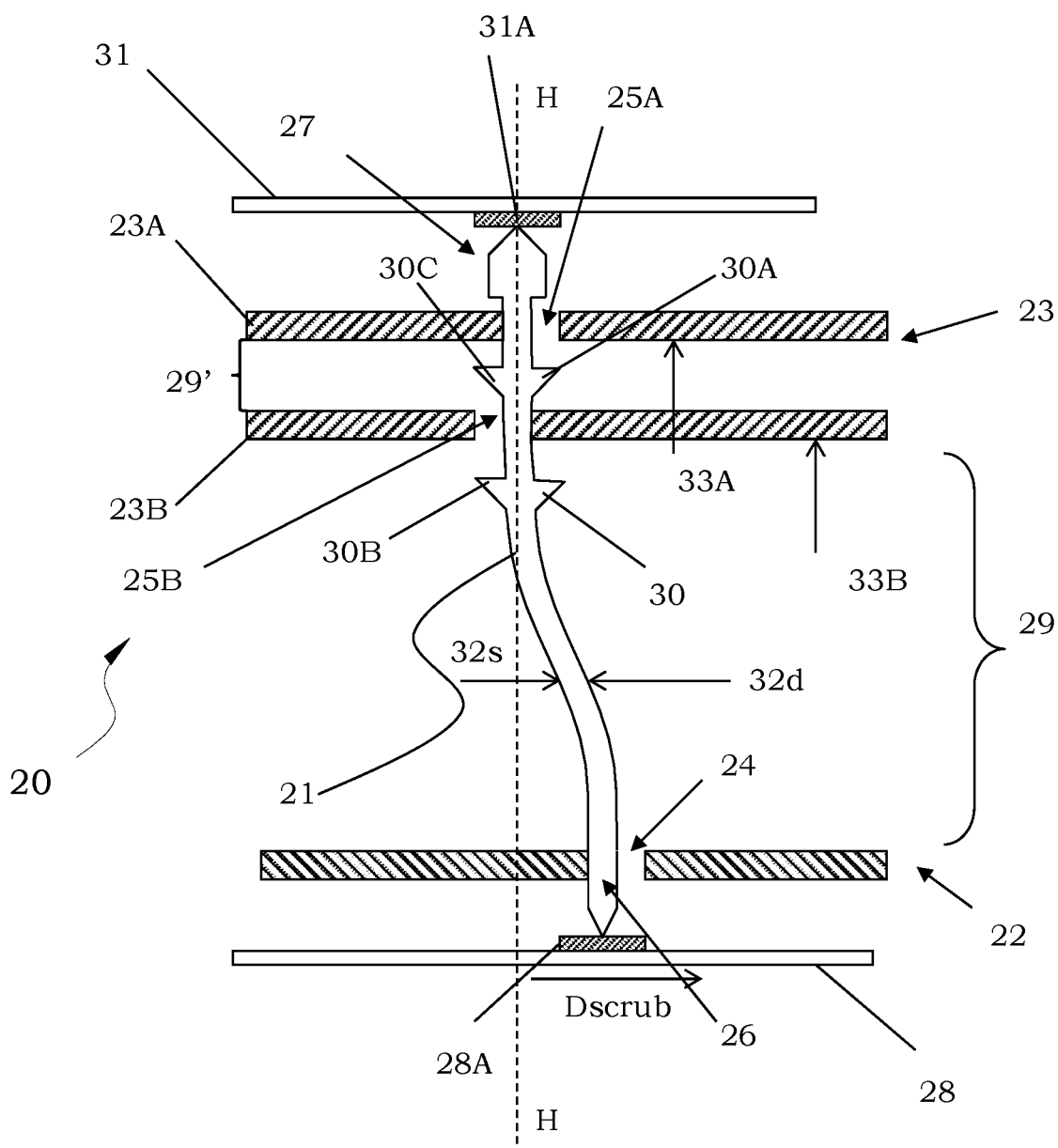

According to a further embodiment shown in FIG. 7, the contact probe 21 can comprise at least four stoppers protruding from the walls of the contact probe 21 and arranged between the guides 23A and 23B of the upper support 23 as well as between the second guide 23B of the upper support 23 and the lower support 22. In particular, the contact probe 21 comprises a first stopper 30 protruding from the second wall 32d of the contact probe 21 and positioned between the second guide 23B of the upper support 23 and the lower support 22, a second stopper 30A protruding from the second wall 32d of the contact probe 21 and positioned between the first guide 23A and the second guide 23B of the upper support 23, as well as a third stopper 30B protruding from the first wall 32s of the contact probe 21 and positioned between the second guide 23B of the upper support 23 and the lower support 22 and a fourth stopper 30C protruding from the first wall 32s of the contact probe 21 and positioned between the first guide 23A and the second guide 23B of the upper support 23.

In this way, the contact probe 21 includes four stoppers symmetrically arranged with respect to the axis HH, a first and a third stopper 30 and 30B being arranged between the upper support 23 and the lower support 22, and a second and a fourth stopper 30A and 30C being arranged between the guides 23A and 23B of the upper support 23.

In this way it is possible to ensure an improved holding due to the fact that a couple of stoppers is always apt to abut onto the undercut walls 33A and 33B of the first and second guide 23A and 23B of the upper support 23, regardless of the assembly angle of the contact probe 21, on the occasion of a possible upward movement of the probe itself (in the local reference system of the Figure).

Figure 8:
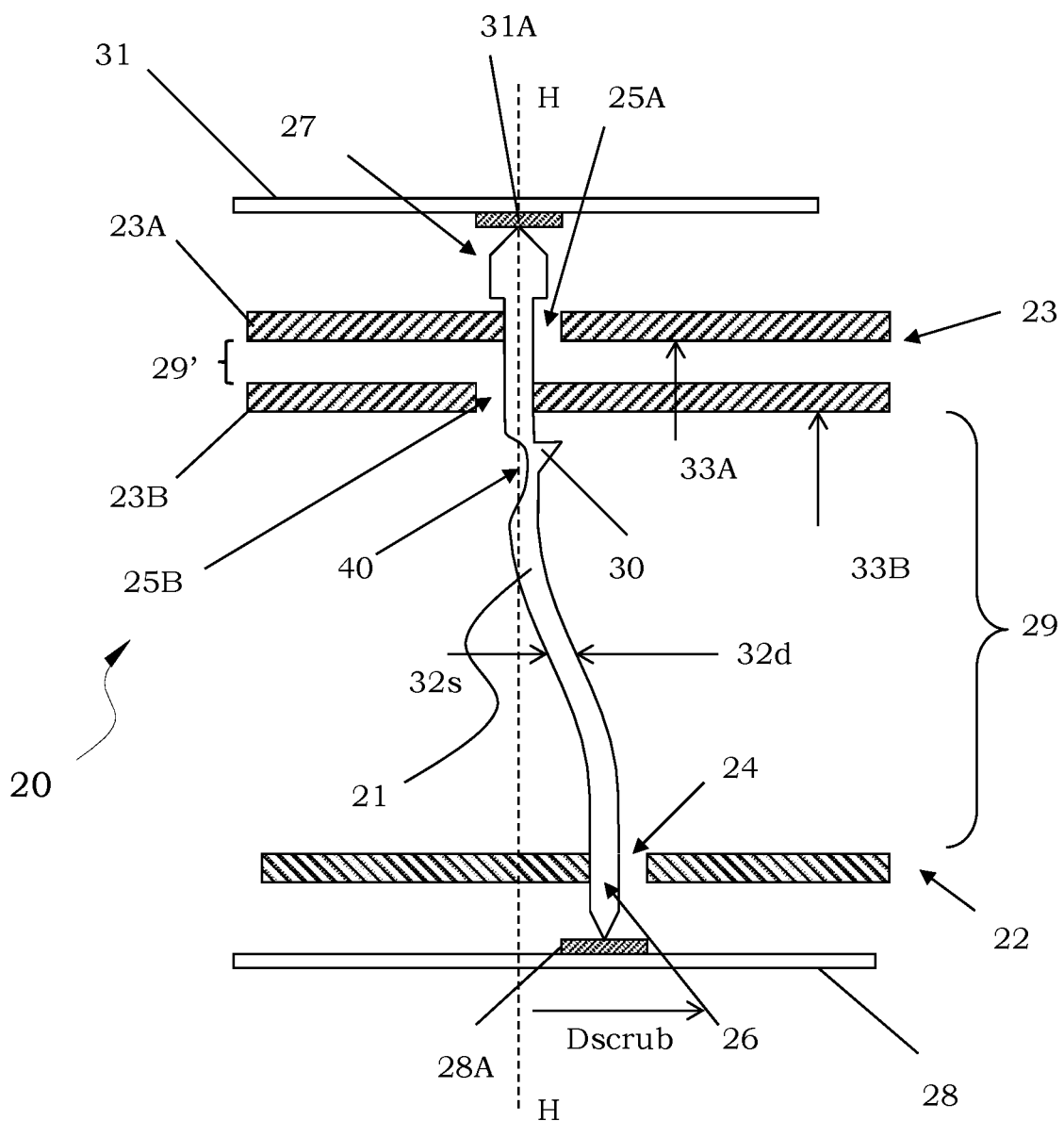

According to a further embodiment, illustrated in FIG. 8, the testing head 20 comprises at least one contact probe 21 provided with a stopper 30 protruding from a wall thereof, in particular from the second wall 32d, as well as a notch 40 realized in an opposite wall of the contact probe 21, in particular the first wall 32s, in correspondence of such stopper 30. In substance, the notch 40 produces a recess in the body 21' of the contact probe 21, the recess having dimensions comparable (in particular with a relative difference lower than 20%) to the lateral protrusion of the stopper 30, compensating for the increased dimension of the contact probe 21 introduced by the stopper 30 itself and thereby allowing to reduce the diameter of the guide holes 25A and 25B realized in the guides 23A and 23B of the upper support 23 in order to ensure the passage of the corresponding contact probe 21 in case of assembly by means of relative displacement of the supports 22 and 23, as explained with reference to FIGS. 4A-4C.

In particular, as already indicated, during the normal operation of the testing head 20, the stopper 30 is not in contact with the upper support 23, so as not to interfere with the movement of the corresponding contact probe 21. Suitably, the stopper 30 acts so as to prevent an upward movement of the contact probe 21.

More in particular, advantageously according to the present disclosure, the stopper 30 is positioned so as to prevent the contact tip 26 of the contact probe 21 from exiting from the lower support 22, in particular from the corresponding guide hole 24. In fact, such movement out of the contact tip 26 makes the testing head 20 that includes the contact probe 21 unusable, until a new alignment of the guide hole 24 with the contact tip 26 is performed once the contact probe 21 has been repositioned.

The stopper 30 is then arranged at a distance D from the upper support 23, in particular from the undercut wall 33B of the second guide 23B, the distance D having a smaller value than the sum of the length Lp of the contact tip 26 protruding outside the testing head from the lower support 22 (and then outside of the gap 29) with a thickness Sp of the lower support 22 itself, in particular corresponding to the height of the respective guide hole 24, i.e. D<Sp+Lp.

It is emphasized that this suitable positioning of the stopper 30 is particularly advantageous in case of use of contact probes of the buckling beams type; in such case, in fact, the possible slipping of the contact tip 26 of a contact probe 21 from the guide hole 24 of the lower support 22 leads to an instantaneous straightening of the probe itself, which would prevent any attempt to repositioning it.

Moreover, the stopper 30 is positioned at a distance D greater than a minimum value equal to 5-10 µm, so as to ensure that such stopper 30 does not interfere with the normal operation of the testing head 20 that includes the contact probe 21. To avoid any interference problem, the distance D is preferably set so as to be greater than 100 µm, more preferably greater than 150 µm.

Figure 9:
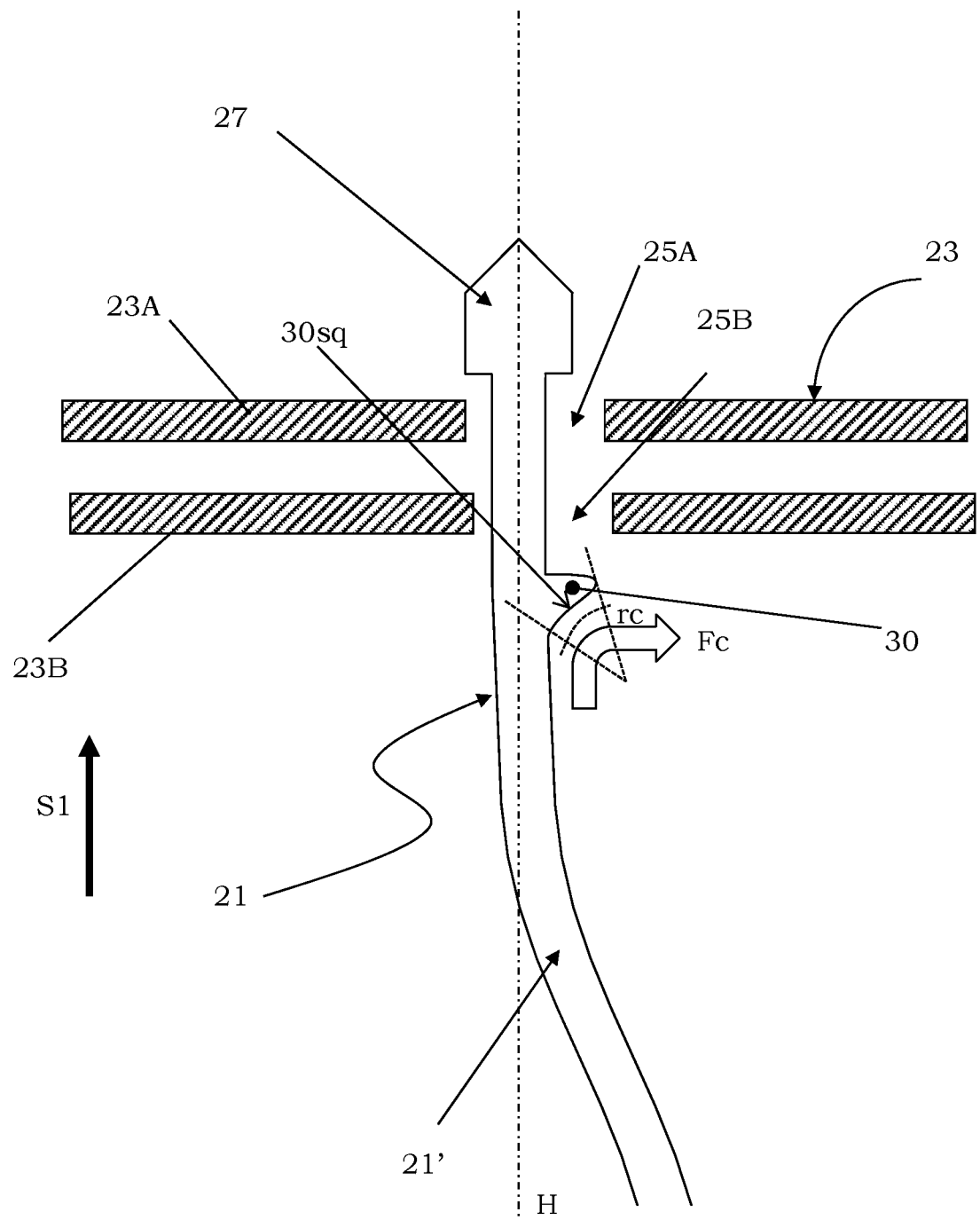
FIG. 9 schematically shows an enlarged view of a detail of the testing head of FIG. 2A, according to a preferred embodiment.

Finally, in a preferred embodiment of the disclosure, schematically illustrated in the enlarged view of FIG. 9, the stopper 30 comprises at least one wall 30sq, in particular an undercut wall having a rounded shape, in particular with a radius of curvature rc having a value between 0.001 µm and 0.1 µm.

Suitably, thanks to this wall 30sq having rounded shape, the stopper 30 facilitates the passage of the contact probe 21 in the guide holes 25A and 25B made in the guides 23A and 23B of the upper support 23, when using the assembly method illustrated with reference to the FIGS. 4A-4C.

In particular, such preferred shape of the stopper 30 is particularly advantageous during the first step of the relative movement of the lower support 22 and the upper support 23, as shown in FIG. 4B, when the upper support 23, and in particular its guides 23A and 23B together, is moved along the direction S1 (also indicated in FIG. 9) from the lower support 22.

In particular, the rounded wall 30sq of the stopper 30 creates a surface that facilitates the sliding of guide holes along that wall, along the direction indicated by the arrow Fc in the Figure.

The testing heads realized according to the present disclosure have been shown to have very high operation performances. Advantageously, the frictional forces, existing between the walls of the contact probes and the walls of the guide holes of the supports that comprise them, are significantly reduced thanks to the use of at least two guides forming at least one of the supports, in particular the upper support, but the presence of at least one stopper ensures the proper functioning of the testing head, in particular the positioning and the holding in the operative measurement condition of the contact probes comprised in it.

The considerations made are also valid for different embodiments not explained here but still object of the present disclosure, such as, for example, a testing head having an upper support comprising a single guide and a lower support comprising at least two guides, as well as the case in which both the upper support and the lower support are realized by means of at least two guides or even a greater number of guides. In addition, the expedients adopted in relation to one embodiment can be used also for other embodiments and can be freely combined with one another even in a number greater than two.

It is emphasized that the reduction of the friction forces inside the testing head results in an improved functioning of the same, as well as in a prolonged life of the individual components, with a consequent economic saving, the adopted configuration preventing an accidental exit of the contact probes from the respective guide holes.

Suitably, the contact head of each contact probe is sized so as to have a dimension higher than the diameter of the guide holes formed in the first guide of the upper support, thereby preventing a passage of the contact head itself through these holes. Additionally, the presence of the stopper is capable of preventing undesired movements of the contact probes on the occasion of cleaning operations of the testing head, which cleaning operations are (as it is well known) usually made by means of powerful air jets in particular able to move the contact probes, and to ensure the holding of the contact probes inside the testing head also on the occasion of the space transformer removal, the counter-force produced by the abutment of the stopper onto a corresponding undercut wall of the guides of the upper support ensuring the breaking of possible oxides which retain the contact heads to the pads of the space transformer itself.

It is noted that during the normal operation of the testing head, the stopper is not in contact with the upper support and thus does not interfere with the movement of the contact probes. Suitably, the stopper acts so as to prevent an upward movement of the contact probe.

In one embodiment, the stopper is positioned so as to prevent the contact tip of the contact probe from exiting from the lower support, in particular from the relative guide hole, which would make the testing head unusable, in particular in case of a buckling beams technology. More particularly, the stopper is positioned at a maximum distance from the upper support, the distance being equal to the sum of the length of the contact tip protruding outside the testing head from the lower support and the height of the guide hole of the lower support.

Suitably, the combined use of at least two guides which realize at least one of the supports of the testing head, the proper sizing of the contact head with respect to the guide holes realized in such guides, and the use of the at least one stopper allow to guarantee a proper functioning of the testing head, in particular the absence of problems of probes getting stuck, as well as the holding of the probes inside the testing head, even in the absence of a device under test or of a space transformer, as well as during possible cleaning operations.

The proposed embodiments allow realizing different contact probes, which are usable in different operative conditions and in particular:

a contact probe usable for only one assembly angle, as shown in FIGS. 2A and 2B; this embodiment is particularly simple and in any case ensures the proper retention of the probe in the testing head also in the absence of a device under test or of a space transformer; moreover, when the stopper is positioned between the guides included in at least one support, i.e. in an additional gap that is defined between them, it is possible to reduce the risk of triggering unwanted breakages in correspondence of the stopper since the stopper is realized in an area with reduced stresses, that area being in particular almost free from bending and in any case with controlled mechanical stress thanks to the reduced possibility of movement of the probe itself;

a contact probe usable for two opposite assembly angles of the probes, as illustrated in FIGS. 5A and 5B, providing at least one pair of stopper; the movement through the guide holes of at least one stopper is prevented on the occasion of an upward movement of the contact probe, the stopper being in correspondence of a wall of the guide hole, that wall being in contact with a wall of the contact probe, regardless of the assembly angle of the probe; also this embodiment is particularly simple and in any case ensures the proper retention of the probe in the testing head, also in absence of a device under test or of a space transformer; furthermore, the positioning of the stoppers in such a way that they protrude from a same wall of the contact probe allows to reduce the overall dimensions of the probe itself;

a contact probe usable for a single assembly angle with improved retention of the probe, as illustrated in FIGS. 6A and 6B, thanks to the use of stoppers protruding from both walls of the contact probe in a symmetrical configuration with respect to a longitudinal axis of the contact probe;

a contact probe usable for both assembly angles with improved retention of the probe, as shown in FIG. 7, thanks to the use of four stoppers protruding from both walls of the contact probe and arranged both between the guides of the upper support and between the upper support and the lower support in a completely symmetrical configuration; according to that embodiment, a couple of stoppers is always apt to abut, on the occasion of an undesired upward movement of the contact probe, onto the undercut walls of the first and second guide of the upper support, regardless of the assembly angle of the contact probe; and a contact probe usable for only one assembly angle with reduction of the dimension of the probe in correspondence of the stopper, as shown in FIG. 8, due to the use of a notch formed at the stopper and apt to compensate for the increase of dimension of the contact probe introduced by the stopper itself.

All the illustrated embodiments allow the use of the simple assembly method described with reference to FIGS. 4A-4C.

It should be also remarked the advantage linked to the fact that the contact probes are realized in a simple way and with reduced costs, with the respective stoppers being integral with the probe body and made directly from a mold by means of conventional photolithographic technologies, or by means of MEMS technology (Micro Electro-Mechanical System), or still with laser technology.

It must be finally pointed out that the stoppers affect a very small length of the body of the contact probes and they can be realized with particularly reduced dimensions (in particular their thickness).

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head for functionality testing an electronic device under test comprising:
 a plurality of vertical contact probes, and
 plate-like first and second supports separated from each other by a gap and provided with respective guide holes in order to slidably house the plurality of vertical contact probes, wherein:
  each contact probe includes a rod-like body, a first end, and a second end, the rod-like body extending along a preset longitudinal axis between the first and second ends, the first end being a contact tip adapted to abut onto a contact pad of the electronic device under test, and the second end being a contact head adapted to abut onto a contact pad of a space transformer,
  the first support comprises a plurality of guides that are parallel to each other and separated by an additional gap and provided with corresponding guide holes and
  each contact probe comprises a lateral wall and a first stopper originating from the lateral wall,
   the first stopper is positioned adjacent to one wall of a guide hole of the guides contacting the lateral wall of the contact probe.

2. The testing head of claim 1, wherein the contact head has a diameter greater than a diameter of the guide holes of the guides and prevents the contact head from passing through the guide holes.

3. The testing head of claim 1, wherein the first stopper is realized protruding from the lateral wall of the contact probe and is configured to abut a wall of at least one of the guides.

4. The testing head of claim 3, wherein the first support is an upper support, the second support is a lower support, and the first stopper is realized between the upper support and the lower support and closer to the upper support than to the lower support.

5. The testing head of claim 3, wherein the first stopper is realized between the guides of the first support, within the additional gap.

6. The testing head of claim 1, wherein the contact probe comprises a second stopper protruding from the same wall from which protrudes the first stopper.

7. The testing head of claim 1, wherein the contact probe comprises a second stopper protruding from an opposing wall with respect to the wall from which protrudes the first stopper.

8. The testing head of claim 1, wherein:
 the contact probe comprises second, third, and fourth stoppers,
 the first, second, third, and fourth stoppers protrude in couples from lateral walls of the contact probe and are arranged symmetrically to the longitudinal axis,
 the first stopper and the second stopper are arranged between the first support and the second support, and
 the third stopper and the fourth stopper are arranged between the guides of the first support.

9. The testing head of claim 1, wherein the contact probe further comprises a notch realized in a wall of the contact probe opposite to the wall from which protrudes the first stopper.

10. The testing head of claim 9, wherein the notch realizes a recess in the rod-like body of the contact probe having dimensions comparable to a lateral protrusion of the first stopper.

11. The testing head of claim 1, wherein the first stopper has a lateral protrusion having dimensions comparable to a diameter of the contact probe and comprised between 5 and 40 μm.

12. The testing head of claim 1, wherein the first stopper is arranged at a distance from the first support less than a sum of a length of the contact tip protruding outside the testing head from the second support and a thickness of the second support.

13. The testing head of claim 1, wherein the first stopper comprises an undercut wall having a rounded shape.

14. The testing head of claim 13, wherein the undercut wall has a radius of curvature between 0.001 μm and 0.1 μm.

15. A testing head for functionality testing an electronic device under test comprising:
- a plurality of vertical contact probes, and
- plate-like first and second supports separated from each other by a gap and provided with respective guide holes in order to slidably house the plurality of contact probes, wherein:
  - each contact probe includes a rod-like body, a first end, and a second end, the rod-like body extending along a preset longitudinal axis between the first and second ends, the first end being a contact tip adapted to abut onto a contact pad of the electronic device under test, and the second end being a contact head adapted to abut onto a contact pad of a space transformer,
  - the first support of the supports comprises a plurality of guides that are parallel to each other and separated by an additional gap and provided with corresponding guide holes, and
  - each contact probe comprises a lateral wall and first stopper protruding from the lateral wall, the lateral wall contacting one wall of at least one of the guide holes of the guides.

16. The testing head of claim 15, wherein the contact head has a diameter greater than a diameter of the guide holes of the guides and prevents the contact head from passing through the guide holes.

17. The testing head of claim 15, wherein the first stopper is realized between the first support and the second support and closer to the first support than to the second support.

18. The testing head of claim 15, wherein the first stopper is realized between the guides of the first support, within the additional gap.

19. The testing head of claim 15, wherein the contact probe comprises a second stopper protruding from the same wall from which protrudes the first stopper.

20. The testing head of claim 15, wherein the contact probe comprises a second stopper protruding from an opposing wall with respect to the wall from which protrudes the first stopper.

21. The testing head of claim 15, wherein:
- the contact probe comprises second, third, and fourth stoppers,
- the first, second, third, and fourth stoppers protrude in couples from walls of the contact probe and are arranged symmetrically to the longitudinal axis of the contact probe,
- the first stopper and the second stopper are arranged between the first support and the second support, and
- the third stopper and the fourth stopper are arranged between the guides of the first support.

22. The testing head of claim 15, wherein the contact probe further comprises a notch realized in a wall of the contact probe opposite to the wall from which protrudes the first stopper.

23. The testing head of claim 22, wherein the notch realizes a recess in the rod-like body of the contact probe having dimensions comparable to a lateral protrusion of the first stopper.

24. The testing head of claim 15, wherein the first stopper has a lateral protrusion having dimensions comparable to a diameter of the contact probe and comprised between 5 and 40 µm.

25. The testing head of claim 15, wherein the first stopper is arranged at a distance from the first support less than a sum of a length of the contact tip protruding outside of the testing head from the second support and a thickness of the second support.

26. The testing head of claim 15, wherein the first stopper comprises an undercut wall having a rounded shape.

27. The testing head of claim 26, wherein the undercut wall has a radius of curvature between 0.001 µm and 0.1 µm.

28. A testing head for functionality testing an electronic device to be tested comprising:
- a plurality of vertical contact probes, and
- plate-like first and second supports separated from each other by a gap and provided with respective guide holes in order to slidably house the plurality of contact probes, wherein:
  - each contact probe includes a rod-like body, a first end, and a second end, the rod-like body extending along a preset longitudinal axis between the first and second ends, the first end being a contact tip adapted to abut onto a contact pad of the device under test, and the second end being a contact head adapted to abut onto a contact pad of a space transformer,
  - the first support comprises a plurality of guides that are parallel to each other and separated by an additional gap and provided with corresponding guide holes,
  - each contact probe comprises a lateral wall and a first stopper protruding the lateral wall and being apt to abut onto an undercut wall of the guides under which the first stopper is positioned,
  - the lateral wall is apt to contact one wall of at least one of the guide holes of the guides, and
  - the contact head has a diameter greater than a diameter of the guide holes of the guides and prevents the contact head from passing through the guide holes.

29. The testing head of claim 28, wherein the first stopper is between the first support and second support and closer to the first support than to the second support.

30. The testing head of claim 28, wherein the first stopper is realized between the guides of the first support, within the additional gap.

31. The testing head of claim 28, wherein the contact probe comprises a second stopper protruding from the same wall from which protrudes the first stopper.

32. The testing head of claim 28, wherein the contact probe comprises a second stopper protruding from an opposing wall with respect to the wall from which protrudes the first stopper.

33. The testing head of claim 28, wherein:
- the contact probe comprises second, third, and fourth stoppers,
- the first, second, third, and fourth stoppers protrude in couples from walls of the contact probe and are arranged symmetrically to the longitudinal axis,
- the first stopper and the second stopper are arranged between the first support and the second support, and
- the third stopper and the fourth stopper are arranged between the guides of the first support.

34. The testing head of claim 28, wherein the contact probe further comprises a notch realized in a wall of the contact probe opposite to the wall from which protrudes the first stopper.

35. The testing head of claim 34, wherein the notch realizes a recess in the rod-like body of the contact probe having dimensions comparable to a lateral protrusion of the the first stopper.

36. The testing head of claim 28, wherein the first stopper has a lateral protrusion having dimensions comparable to a diameter of the contact probe and comprised between 5 and 40 μm.

37. The testing head of claim 28, wherein the first stopper is arranged at a distance from the first support less than a sum of a length of the contact tip protruding outside of the testing head from the second support and a thickness of the second support.

38. The testing head of claim 28, wherein the first stopper comprises an undercut wall having a rounded shape.

39. The testing head of claim 38, wherein the undercut wall has a radius of curvature between 0.001 μm and 0.1 μm.

40. A method for assembling a testing head comprising:
a plurality of vertical contact probes, and
plate-like lower and upper supports separated from each other by a suitable gap and provided with respective guide holes in order to slidably house the plurality of contact probes,
the upper support comprising first and second guides that are parallel to each other and separated by an additional gap and provided with corresponding guide holes and each contact probe comprising first stopper originating from a lateral wall of the contact probe,
the method comprising at least the steps of:
overlapping the lower support and the first and second guides of the upper support having respective guide holes concentric to each other;
inserting the contact probes in the respective guide holes;
a first relative movement of the upper support, the first and second guides moving together, with respect to the lower support along a first direction, perpendicular to the upper and lower supports, passing the first stopper through the corresponding guide holes of the upper support; and
a second relative movement of the upper support, the first and second guides moving together, with respect to the lower support along a second direction, parallel to the first and second supports.

41. The method of claim 40, further comprising a third relative movement of the first and second guides of the upper support with respect to each other along a third direction, parallel to the guides.

* * * * *